US012701844B2

(12) United States Patent
Cheng

(10) Patent No.: US 12,701,844 B2
(45) Date of Patent: Aug. 4, 2026

(54) SEMICONDUCTOR LIGHT-EMITTING DEVICE AND PREPARATION METHOD THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 432 days.

(21) Appl. No.: 18/308,523

(22) Filed: Apr. 27, 2023

(65) Prior Publication Data

US 2023/0261031 A1     Aug. 17, 2023

Related U.S. Application Data

(63) Continuation of application No. PCT/CN2021/081834, filed on Mar. 19, 2021.

(51) Int. Cl.
*H10H 29/10*          (2025.01)

(52) U.S. Cl.
CPC ................................... *H10H 29/10* (2025.01)

(58) Field of Classification Search
None
See application file for complete search history.

(56) References Cited

U.S. PATENT DOCUMENTS

2008/0211400 A1     9/2008   Kim et al.
2010/0244679 A1*   9/2010   Fujita .................... H10K 50/13
                                                                        313/506

2019/0019839 A1*   1/2019   Tian ...................... H10H 29/10
2019/0229149 A1*   7/2019   Yoo ...................... H10H 29/142
2020/0058824 A1     2/2020   Jang et al.

FOREIGN PATENT DOCUMENTS

| CN | 1423345 | A | 6/2003 |
| CN | 107256862 | A | 10/2017 |
| CN | 109791998 | A | 5/2019 |
| CN | 110689814 | A | 1/2020 |
| CN | 110767670 | A | 2/2020 |
| CN | 111354757 | A | 6/2020 |
| JP | H08293625 | A | 11/1996 |

OTHER PUBLICATIONS

International Search Report issued in corresponding PCT Application No. PCT/CN2021/081834, dated Dec. 14, 2021.
Written Opinion ssued in corresponding PCT Application No. PCT/CN2021/081834, dated Dec. 14, 2021.

* cited by examiner

*Primary Examiner* — Bilkis Jahan
(74) *Attorney, Agent, or Firm* — Westbridge IP LLC

(57)          ABSTRACT

Disclosed are a semiconductor light-emitting device and a preparation method for the semiconductor light-emitting device. The semiconductor light-emitting device having a red light sub-pixel region, a green light sub-pixel region, and a blue light sub-pixel region includes a substrate and a blue light epitaxial layer epitaxially grown on the substrate, and a green light epitaxial layer and a red light epitaxial layer continually grown on the green light sub-pixel region and the red light sub-pixel region, respectively, on the blue light epitaxial layer, the green light epitaxial layer and the red light epitaxial layer being distributed on the blue light epitaxial layer at an interval.

15 Claims, 5 Drawing Sheets

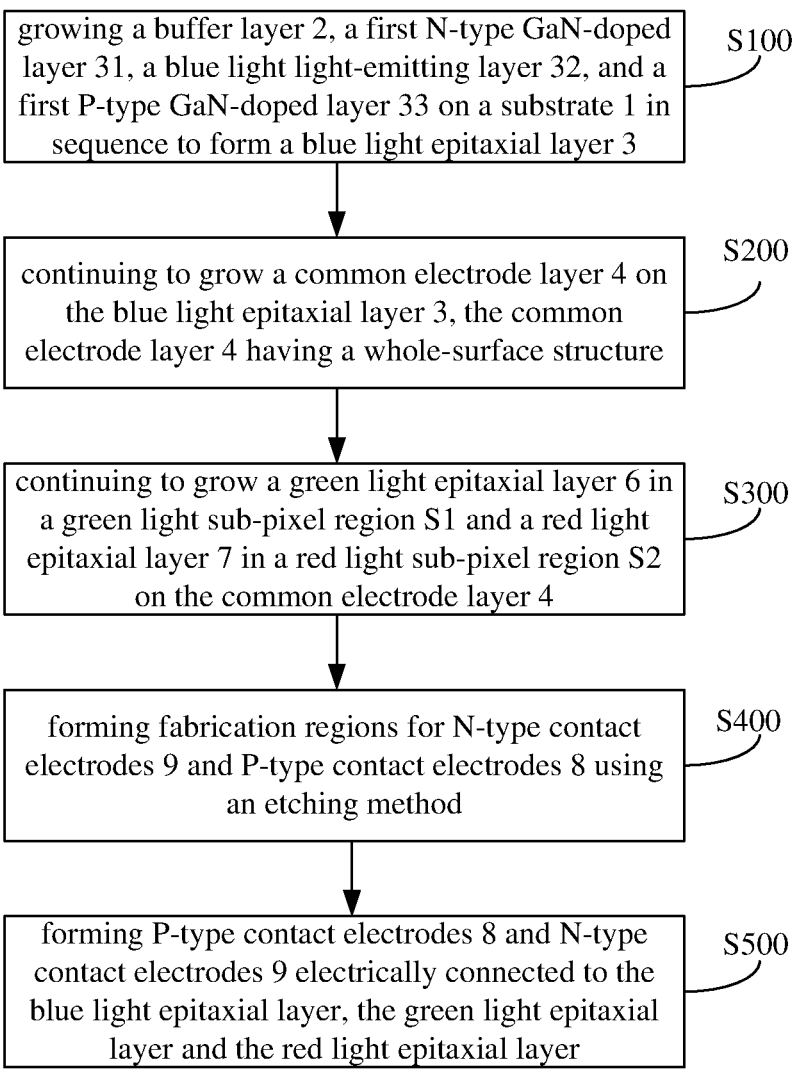

growing a buffer layer 2, a first N-type GaN-doped layer 31, a blue light light-emitting layer 32, and a first P-type GaN-doped layer 33 on a substrate 1 in sequence to form a blue light epitaxial layer 3 — S100 continuing to grow a common electrode layer 4 on the blue light epitaxial layer 3, the common electrode layer 4 having a whole-surface structure — S200 continuing to grow a green light epitaxial layer 6 in a green light sub-pixel region S1 and a red light epitaxial layer 7 in a red light sub-pixel region S2 on the common electrode layer 4 — S300 forming fabrication regions for N-type contact electrodes 9 and P-type contact electrodes 8 using an etching method — S400 forming P-type contact electrodes 8 and N-type contact electrodes 9 electrically connected to the blue light epitaxial layer, the green light epitaxial layer and the red light epitaxial layer — S500

FIG. 10

SEMICONDUCTOR LIGHT-EMITTING DEVICE AND PREPARATION METHOD THEREOF

CROSS-REFERENCE TO RELATED APPLICATIONS

The present application is a continuation application of International Application No. PCT/CN2021/081834, filed on Mar. 19, 2021, which is hereby incorporated by reference in its entirety.

TECHNICAL FIELD

This disclosure relates to the technical field of semiconductors, and in particular, to a semiconductor light-emitting device and a preparation method for the semiconductor light-emitting device.

BACKGROUND

As an optoelectronic device, a gallium nitride-based (GaN-based) light-emitting diode (LED) is widely used in many display fields due to its advantages of long service life, good stability and low energy consumption, such as micro-projection display, head wearable display, augmented reality (AR), virtual reality (VR), wearable display and other display fields.

At present, a size of a GaN-based LED chip can be controlled in a micron scale. If the GaN-based LED chip of the micron scale is used as a display pixel, a display system with high resolution, low energy consumption, and thinness can be realized.

With the development of display technology, new demands are put forward for the resolution and color of display pixels. How to realize full-color display through the GaN-based LED chip has become an urgent problem to be solved.

The Light-emitting diode, or LED for short, radiates visible light using the recombination between electrons and holes. The two main application areas for the LEDs include: lighting and displays. Especially in the display field, future development trends include: a higher picture quality and a higher definition (more pixels and smaller size pixels). The key technology to realize high-definition display is to realize ultra-small light-emitting pixels, which requires smaller-sized full-color LED light-emitting units.

SUMMARY

The purpose of this disclosure is to provide a semiconductor light-emitting device and a preparation method for the semiconductor light-emitting device.

This disclosure provides a semiconductor light-emitting device having a red light sub-pixel region, a green light sub-pixel region and a blue light sub-pixel region, including:

a substrate and an epitaxial layer epitaxially grown on the substrate, the epitaxial layer including a blue light epitaxial layer epitaxially grown on the substrate, and a green light epitaxial layer and a red light epitaxial layer continually grown on the green light sub-pixel region and the red light sub-pixel region, respectively, on the blue light epitaxial layer, and the green light epitaxial layer and the red light epitaxial layer being distributed on the blue light epitaxial layer at an interval; and P-type contact electrodes and N-type contact electrodes electrically connected to the blue light epitaxial layer, the green light epitaxial layer and the red light epitaxial layer.

Optionally, the blue light epitaxial layer includes a first N-type GaN-doped layer, a blue light light-emitting layer and a first P-type GaN-doped layer grown in sequence; the green light epitaxial layer includes a second N-type GaN-doped layer, a green light light-emitting layer and a second P-type GaN-doped layer grown in sequence; and the red light epitaxial layer includes the second N-type GaN-doped layer, a red light light-emitting layer and the second P-type GaN-doped layer grown in sequence.

The P-type contact electrodes are electrically connected to the first P-type GaN-doped layer, the second P-type GaN-doped layer in the red light epitaxial layer and the second P-type GaN-doped layer in the green light epitaxial layer respectively, and the N-type contact electrodes are electrically connected to the first N-type GaN-doped layer, the second N-type GaN doped layer in the red light epitaxial layer and the second N-type GaN-doped layer in the green light epitaxial layer respectively.

Optionally, the blue light light-emitting layer is a GaN layer doped with indium element; the green light light-emitting layer is a GaN layer doped with indium element; the red light light-emitting layer is a GaN layer doped with indium element; a proportion of indium doped in the red light light-emitting layer is greater than a proportion of indium doped in the green light light-emitting layer, and the proportion of indium doped in the green light light-emitting layer is greater than a proportion of indium doped in the blue light light-emitting layer.

Optionally, the semiconductor light-emitting device further includes a blue light DBR reflective layer formed between the first N-type GaN-doped layer and the substrate, and the blue light DBR reflective layer is adjacent to the first N-type GaN-doped layer.

Optionally, the semiconductor light-emitting device further includes an insulating dielectric mask layer, wherein the insulating dielectric mask layer is disposed on the blue light epitaxial layer, the insulating dielectric mask layer has through holes, and the green light epitaxial layer and the red light epitaxial layer are distributed in the through holes of the insulating dielectric mask layer at an interval.

Optionally, the semiconductor light-emitting device further includes light shielding structures, wherein the light shielding structures are disposed on both sides of the red light sub-pixel region and the green light sub-pixel region.

Optionally, the semiconductor light-emitting device further includes a common electrode layer, wherein the common electrode layer is formed above the blue light epitaxial layer, the green light epitaxial layer and the red light epitaxial layer are continually grown in the green light sub-pixel region and the red light sub-pixel region, respectively, on the common electrode layer, and the green light epitaxial layer and the red light epitaxial layer are distributed on the common electrode layer at an interval.

Optionally, an entire surface of the blue light epitaxial layer is electroluminescent, and the green light epitaxial layer and the red light epitaxial layer continued to grow in the green light sub-pixel region and the red light sub-pixel region, respectively, on the blue light epitaxial layer are both electroluminescent and photoluminescent.

Optionally, the semiconductor light-emitting device further includes an isolation trench separating a blue light epitaxial layer of the blue light sub-pixel region and a blue light epitaxial layer of the red light sub-pixel region and the green light sub-pixel region from each other.

In another aspect, this disclosure provides a preparation method for a semiconductor light-emitting device, including:

growing a buffer layer, a first N-type GaN-doped layer, a blue light light-emitting layer, and a first P-type GaN-doped layer on a substrate in sequence to form a blue light epitaxial layer;

continuing to grow a common electrode layer on the blue light epitaxial layer, the common electrode layer having an entire-surface structure;

continuing to grow a green light epitaxial layer and a red light epitaxial layer in a green light sub-pixel region and a red light sub-pixel region, respectively, on the common electrode layer, the green light epitaxial layer and the red light epitaxial layer being distributed on the common electrode layer at an interval;

forming fabrication regions for N-type contact electrodes and P-type contact electrodes using an etching method; and forming P-type contact electrodes and N-type contact electrodes electrically connected to the blue light epitaxial layer, the green light epitaxial layer and the red light epitaxial layer.

Optionally, continuing to grow a green light epitaxial layer and a red light epitaxial layer in a green light sub-pixel region and a red light sub-pixel region, respectively, on the common electrode layer, the green light epitaxial layer and the red light epitaxial layer being distributed on the common electrode layer at an interval includes:

depositing an insulating dielectric mask layer on the common electrode layer for a first time, etching a first through hole, corresponding to the green light sub-pixel region, in the insulating dielectric mask layer using an etching method, and continuing to grow the green light epitaxial layer on the common electrode layer exposed by the first through hole; and depositing the insulating dielectric mask layer on the remained insulating dielectric mask layer and the green light epitaxial layer for a second time, etching a second through hole, corresponding to the red light sub-pixel region, in the insulating dielectric mask layer using an etching method, and continuing to grow the red light epitaxial layer on the common electrode layer exposed by the second through hole.

Optionally, continuing to grow a green light epitaxial layer and a red light epitaxial layer in a green light sub-pixel region and a red light sub-pixel region, respectively, on the common electrode layer, the green light epitaxial layer and the red light epitaxial layer being distributed on the common electrode layer at an interval includes:

depositing an insulating dielectric mask layer on the common electrode layer, etching through holes in the insulating dielectric mask layer corresponding to the green light sub-pixel region and the red light sub-pixel region using the etching method, and continuing to grow the green light epitaxial layer and the red light epitaxial layer on the common electrode layer exposed by the through holes, wherein an area of the green light sub-pixel region and an area of the red light sub-pixel region are different.

BRIEF DESCRIPTION OF THE DRAWINGS

FIG. 10 is a schematic flowchart of a preparation method according to an embodiment of this disclosure.

DETAILED DESCRIPTION OF THE EMBODIMENTS

Exemplary embodiments will be described in detail herein, and examples of which are illustrated in the accompanying drawings. When the following description refers to the drawings, the same numerals in different drawings represent the same or similar elements unless otherwise indicated. The embodiments described in the following exemplary embodiments are not intended to represent all embodiments consistent with this disclosure. Rather, they are merely examples of apparatuses consistent with some aspects of this disclosure, as recited in the appended claims.

Usually, when preparing a GaN-based LED for full-color display, the following method is used: a buffer layer and an N-type doped layer are sequentially grown on the substrate, and then a sub-pixel structure is grown on each sub-pixel region of the N-type doped layer. Each sub-pixel structure sequentially includes a three-color quantum well structure (i.e., a blue light quantum well structure, a green light quantum well structure, and a red light quantum well structure) and a P-type doped layer. Then, N-type contact electrode and P-type contact electrodes are prepared.

Embodiment 1

Figure 1:
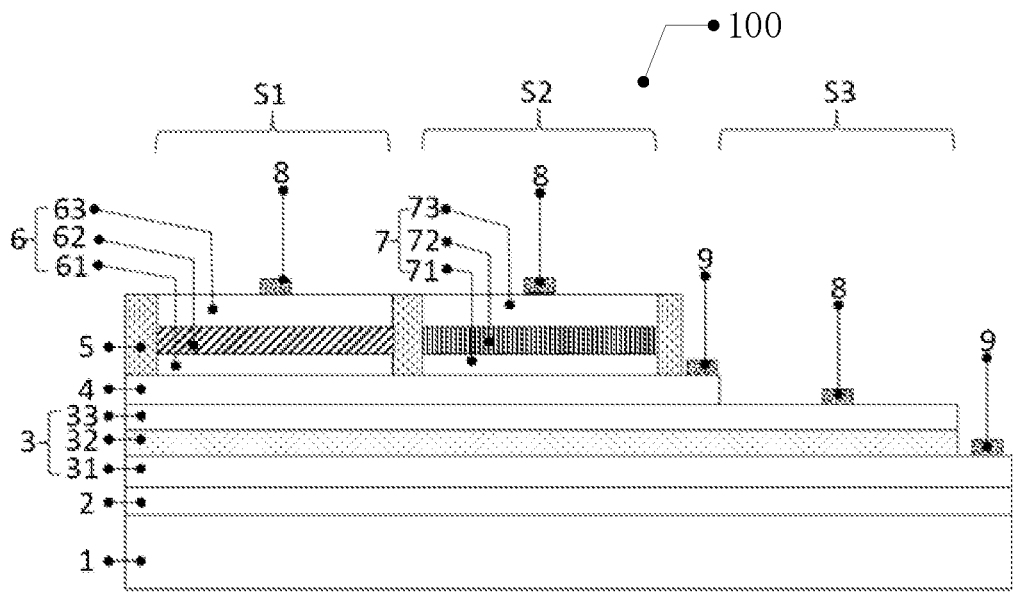
FIG. 1 is a schematic structural diagram of a semiconductor light-emitting device according to Embodiment 1 of this disclosure.

FIG. 1 is a schematic structural diagram of a semiconductor light-emitting device according to a first embodiment of this disclosure. Embodiment 1 of this disclosure provides a semiconductor light-emitting device 100 for realizing full-color display while improving luminous efficiency and reducing power consumption. As shown in FIG. 1, the semiconductor light-emitting device 100 of this embodiment includes a substrate 1, a blue light epitaxial layer 3 epitaxially grown on the substrate 1, a green light epitaxial layer 6 and a red light epitaxial layer 7 continually grown on a green light sub-pixel region S1 and a red light sub-pixel region S2, respectively, on the blue light epitaxial layer, and the red light epitaxial layer 7 and the green light epitaxial layer 6 being distributed on the blue light epitaxial layer 3 at an interval, and P-type contact electrodes 8 and N-type contact electrodes 9 electrically connected to the blue light epitaxial layer, the green light epitaxial layer and the red light epitaxial layer.

As shown in FIG. 1, the blue light epitaxial layer 3 includes a first N-type GaN-doped layer 31, a blue light light-emitting layer 32 and a first P-type GaN-doped layer 33 grown in sequence; the red light epitaxial layer 7 includes a second N-type GaN-doped layer 71, a red light light-emitting layer 72 and a second P-type GaN-doped layer 73 grown in sequence; the green light epitaxial layer 6 includes a second N-type GaN-doped layer 61, a green light light-emitting layer 62, and a second P-type GaN-doped layer 63 grown in sequence; the above-mentioned P-type contact electrodes 8 and N-type contact electrodes 9 that are electrically connected to the blue light epitaxial layer, the green light epitaxial layer and the red light epitaxial layer, specifically, the P-type contact electrodes 8 are electrically connected to the first P-type GaN-doped layer 33, the second P-type GaN-doped layer 63 and the second P-type GaN-doped layer 73, and the N-type contact electrodes 9 are electrically connected to the first N-type GaN-doped layer 31, the second N-type GaN-doped layer 71 and the second N-type GaN-doped layer 61.

The substrate 1 may be made of a III-V semiconductor material or a II-VI semiconductor material. For example, the substrate 1 may be a silicon substrate. Of course, the substrate 1 may also be a silicon carbide substrate, but the embodiments of this disclosure are not limited thereto. The substrate 1 may also be a sapphire substrate. The substrate 1 may also be a composite substrate, for example, a gallium nitride-silicon carbide composite substrate is formed by epitaxial growing gallium nitride on silicon carbide, and a silicon arsenide-germanium composite substrate is formed by epitaxial growing silicon arsenide on germanium. The composite substrate alleviates the lattice mismatch and thermal mismatch of an ordinary sapphire substrate when being used for growing the GaN-based semiconductor material, thereby reducing the existing cost of growing substrates for the GaN-based semiconductor and improving the quality of the light-emitting structure of the subsequently grown gallium nitride-based semiconductor material.

In this embodiment, the blue light light-emitting layer 32 is a GaN layer doped with indium element; the red light light-emitting layer 72 is a GaN layer doped with indium element; and the green light light-emitting layer 62 is a GaN layer doped with indium element. A proportion of indium element doped in the red light light-emitting layer 72 is greater than a proportion of indium element doped in the green light light-emitting layer 62, and the proportion of indium element doped in the green light light-emitting layer 62 is greater than a proportion of indium element doped in the blue light light-emitting layer 32.

The light-emitting layer may be at least one of a single quantum well structure, a multiple quantum well (MQW) structure, a quantum wire structure, and a quantum dot structure. In an example, the light-emitting layer in this embodiment is a multi-quantum well structure, and the light-emitting layer may include potential well layers and potential barrier layers that are alternately disposed. First, the emission wavelength of the quantum well structure is controlled by changing the proportion of indium (In) element doped in the quantum well structure, thereby realizing the display of three colors of blue, green and red. For example, by controlling the proportion of In element doped in the blue light light-emitting layer 32, the blue light light-emitting layer 32 may emit blue light when an emission wavelength of the blue light light-emitting layer 32 is 450 nm-480 nm; by controlling the proportion of In element doped in the green light light-emitting layer 62, the green light light-emitting layer 62 may emit green light when an emission wavelength of the green light light-emitting layer 62 is 500 nm-550 nm; and by controlling the proportion of In element doped in the red light light-emitting layer 72, the red light light-emitting layer 72 may emit red light when an emission wavelength of the red light light-emitting layer 72 is 620 nm-720 nm.

Specifically, as shown in FIG. 1, the semiconductor light-emitting device 100 in this embodiment further includes a GaN buffer layer 2 formed between the first N-type GaN-doped layer 31 and the substrate 1.

Specifically, as shown in FIG. 1, the semiconductor light-emitting device 100 in this embodiment further includes an insulating dielectric mask layer 5. The insulating dielectric mask layer 5 is disposed on the blue light epitaxial layer 3, and the insulating dielectric mask layer 5 has through holes. The red light epitaxial layer 7 and the green light epitaxial layer 6 are distributed in the through holes of the insulating dielectric mask layer 5 at an interval.

Specifically, as shown in FIG. 1, the semiconductor light-emitting device 100 in this embodiment further includes a common electrode layer 4, and the common electrode layer 4 is formed above the blue light epitaxial layer 3. The green light epitaxial layer 6 and the red light epitaxial layer 7 are continually grown in a green light sub-pixel region S1 and a red light sub-pixel region S2 respectively, and the green light epitaxial layer 6 and the red light epitaxial layer 7 are distributed on the common electrode layer 4 at an interval.

For a material of the common electrode layer 4 and a formation method thereof, reference may be made to the material of the second N-type GaN-doped layer and the formation method thereof. The common electrode layer 4 is used to electrically connect the second N-type GaN-doped layer 71 of the red light epitaxial layer 7 and the second N-type GaN-doped layer 61 of the green light epitaxial layer 6. For example, the common electrode layer 4 is formed between the blue light epitaxial layer 3 and the insulating dielectric mask layer 5, the common electrode layer 4 is exposed by the through holes of the insulating dielectric mask layer 5, and the second N-type GaN-doped layer, the light-emitting layer and the second P-type GaN-doped layer are continually grown on the common electrode layer 4 exposed by the through holes. It should be noted that because the material of the common electrode layer 4 is also an N-type GaN-doped, the light-emitting layer and the second P-type GaN-doped layer may directly grow on the common electrode layer 4 while the second N-type GaN-doped layers 61 in the green light epitaxial layer 6 and the second N-type GaN-doped layers 71 in the red light epitaxial layer 7 are omitted.

As shown in FIG. 1, as the presence of the common electrode layer 4, the N-type contact electrodes 9 electrically connected to the green light epitaxial layer 6 and the red light epitaxial layer 7 may be disposed on the common electrode layer 4, which simplifies a manufacture process and reduces the damage of the light-emitting device caused by the electrode manufacture process, thereby improving the performance of the light-emitting device.

Figure 2:
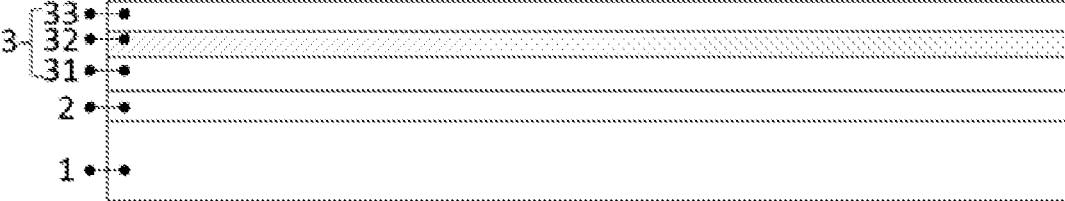
FIG. 2 is a schematic diagram after the completion of step S100 of a preparation method for the semiconductor light-emitting device according to Embodiment 1 of this disclosure.
Figure 3:
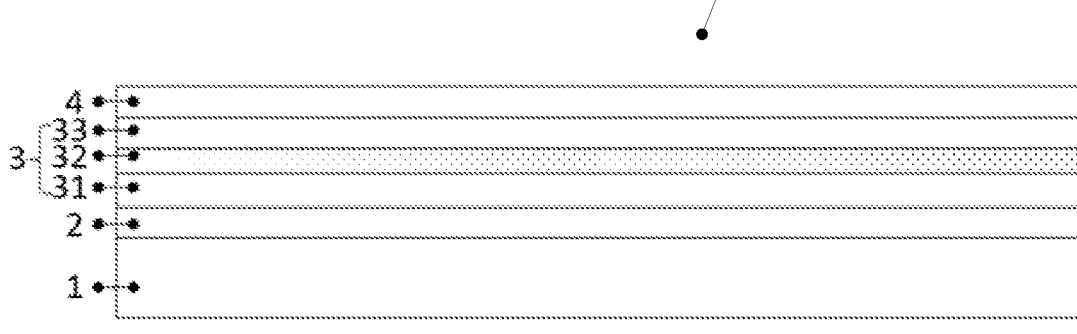
FIG. 3 is a schematic diagram after the completion of step S200 of the preparation method for the semiconductor light-emitting device according to Embodiment 1 of this disclosure.
Figure 4:
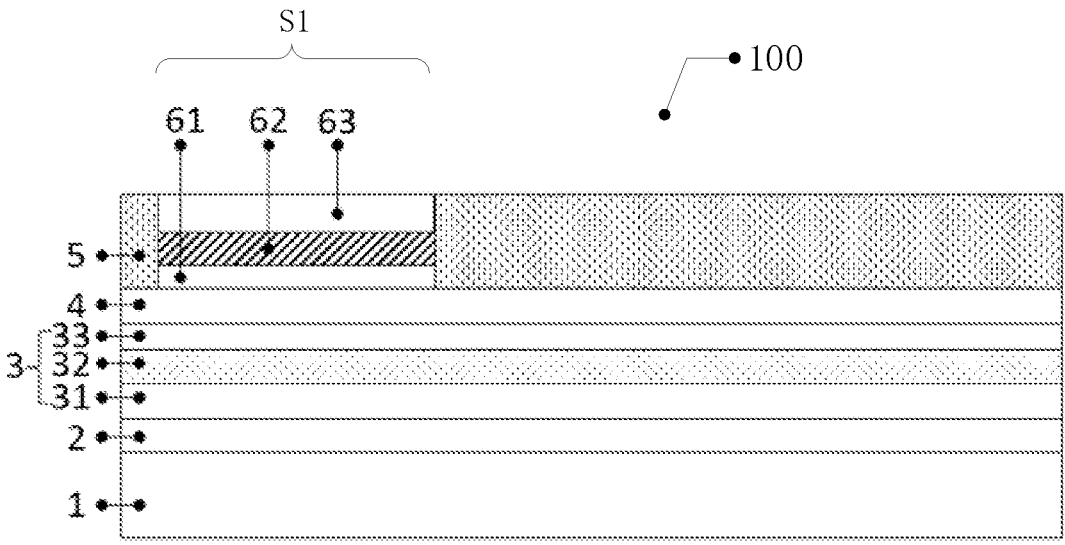
FIG. 4 is a schematic diagram after the completion of the growth of the red light epitaxial layer in step 300 of the preparation method for the semiconductor light-emitting device according to Embodiment 1 of this disclosure.
Figure 5:
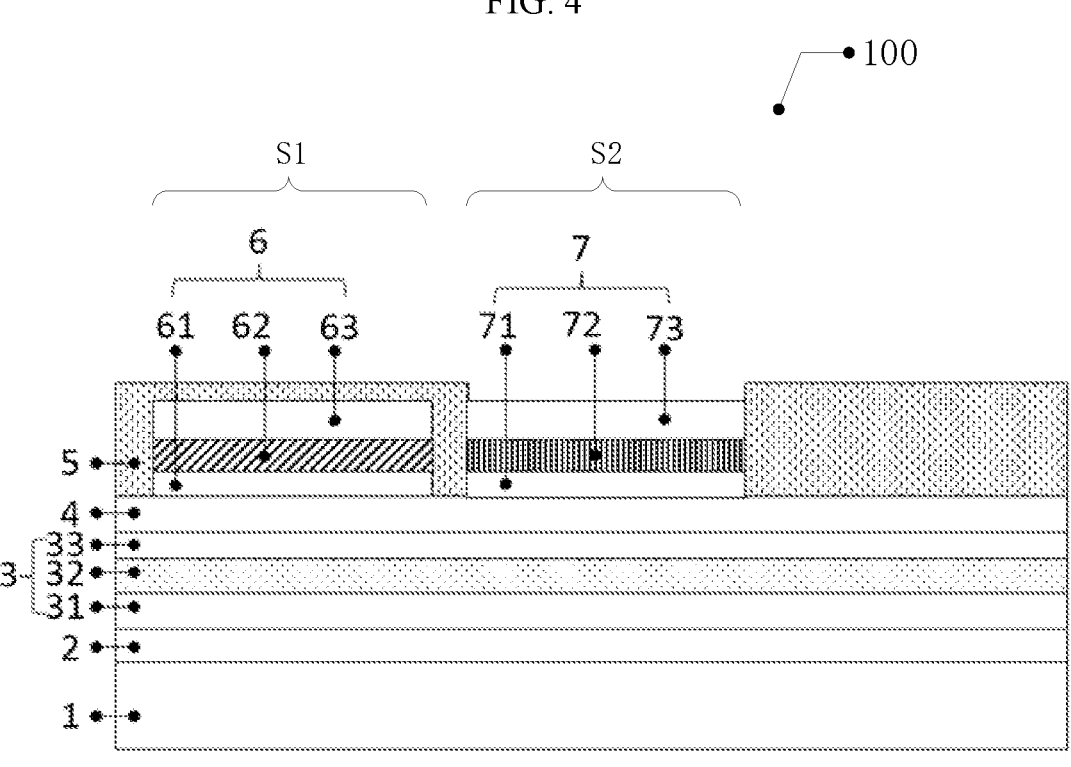
FIG. 5 is a schematic diagram after the completion of the growth of the green light epitaxial layer in step S300 of the preparation method for the semiconductor light-emitting device according to Embodiment 1 of this disclosure.

A preparation method for the semiconductor light-emitting device 100 according to the Embodiment 1 of this disclosure is provided. FIG. 2 is a schematic diagram after the completion of step S100 of the preparation method for the semiconductor light-emitting device 100 according to the Embodiment 1 of this disclosure. FIG. 3 is a schematic diagram after the completion of step S200 of the preparation method for the semiconductor light-emitting device 100 according to the Embodiment 1 of this disclosure. FIG. 4 is a schematic diagram after the completion of the growth of the green light epitaxial layer in step S300 of the preparation method for the semiconductor light-emitting device 100 according to the Embodiment 1 of this disclosure. FIG. 5 is a schematic diagram after the completion of the growth of the red light epitaxial layer in step S300 of the preparation method for the semiconductor light-emitting device according to the Embodiment 1 of this disclosure.

As shown in FIG. 10, the details are introduced as follows.

Step S100: growing a buffer layer 2, a first N-type GaN-doped layer 31, a blue light light-emitting layer 32, and a first P-type GaN-doped layer 33 on a substrate 1 in sequence to form a blue light epitaxial layer 3, as shown in FIG. 2.

Step S200: continuing to grow a common electrode layer 4 on the blue light epitaxial layer 3, the common electrode layer 4 having a whole-surface structure, as shown in FIG. 3.

Step S300: continuing to grow a green light epitaxial layer 6 in a green light sub-pixel region S1 and a red light epitaxial layer 7 in a red light sub-pixel region S2 on the common electrode layer 4, the green light epitaxial layer 6 and the red light epitaxial layer 7 being distributed on the common electrode layer 4 at an interval.

For example, an insulating dielectric mask layer 5 is deposited on the common electrode layer 4 for the first time, and the green light epitaxial layer 6 and the red light epitaxial layer 7 are further grown in the through holes using an etching method. Specifically, as shown in FIG. 1 and FIG. 4, a through hole corresponding to the green light sub-pixel region S1 is etched using tan etching method in the insulating dielectric mask layer 5 as a growth region of the green light epitaxial layer 6, and the etching is to a depth that the common electrode layer 4 is exposed. A second N-type GaN-doped layer 61, a green light light-emitting layer 62 and a second P-type GaN-doped layer 63 continue to epitaxially grow in sequence on the common electrode layer 4 exposed by the through hole. The insulating dielectric mask layer 5 can be prepared by vapor deposition, of course, it may also be prepared by other methods. In the embodiment of this disclosure, the insulating dielectric mask layer 5 may be patterned through a photolithography process.

Further, as shown in FIG. 1 and FIG. 5, the insulating dielectric mask layer 5 is deposited for the second time on the surface of the remaining insulating dielectric mask layer 5 and the second P-type GaN-doped layer 63 of the green light epitaxial layer 6, and then a through hole, corresponding to the red light sub-pixel region S2, is etched using an etching method in the insulating dielectric mask layer 5 as a growth region of the red light epitaxial layer 7, and the etching is to a depth that the common electrode layer 4 is exposed. A second N-type GaN-doped layer 71, a red light light-emitting layer 72 and a second P-type GaN-doped layer 73 continue to epitaxially grow in sequence in the growth region of the red light epitaxial layer 7.

Step S400: forming fabrication regions for N-type contact electrodes 9 and P-type contact electrodes 8 using an etching method. Specifically, N-type contact electrodes fabrication regions of the green light epitaxial layer 6 and the red light epitaxial layer 7 are etched in the insulating dielectric mask layer 5, and the etching is to a depth that the common electrode layer 4 is exposed. The insulating dielectric mask layer 5 and the common electrode layer 4 on the blue light sub-pixel region S3 are further removed, and the etching is to a depth that the first P-type GaN-doped layer 33 is exposed. It should be noted that the blue light sub-pixel region S3 only corresponds to a part of the blue light epitaxial layer 3. The fabrication regions of the N-type contact electrodes 9 are etched in the blue light epitaxial layer 3, and the etching is to a depth that the first N-type GaN-doped layer 31 is exposed. In practice, the groove in the fabrication region can be realized by dry etching or wet etching. The dry etching may be inductively coupled plasma etching (ICP). An etching gas may include: $Cl_2$ and $BCl_3$. An etching solution for wet etching may be $H_3PO_4$ solution or KOH solution.

Step S500: forming P-type contact electrodes 8 and N-type contact electrodes 9 electrically connected to the blue light epitaxial layer, the green light epitaxial layer and the red light epitaxial layer. Specifically, P-type contact electrodes 8 are respectively formed on the first P-type GaN-doped layer 33 of the blue light epitaxial layer 3, and the second P-type GaN-doped layer 73 of the red light epitaxial layer 7 and the second P-type GaN-doped layer 63 of the green light epitaxial layer 6, and N-type contact electrodes 9 are formed on the first N-type GaN-doped layer 31 and the common electrode layer 4. Materials of the P-type contact electrodes 8 and the N-type contact electrodes 9 may be selected from at least one of gold, silver, aluminum, chromium, nickel, platinum, and titanium.

The structure of the semiconductor light-emitting device prepared by the above method may be as shown in FIG. 1. It should be noted that the semiconductor light-emitting device shown in FIG. 1 only shows three sub-pixel structures grown on three sub-pixel regions, and the three sub-pixel structures are used to emit blue light, green light and red light respectively. In practice, the semiconductor light-emitting device may include multiple sub-pixel structures, each sub-pixel structure can be used as a sub-pixel of a full-color display semiconductor light-emitting device, and every three sub-pixel structures in the multiple sub-pixel structures can be used as a pixel of a full-color display LED chip.

In the semiconductor light-emitting device of the embodiment of this application, the independent light-emitting region structures are superimposed on a substrate through epitaxial growth. In the Embodiment 1, the red light epitaxial layer and the green light epitaxial layer are superimposed on the blue light epitaxial layer. Therefore, photons generated in the blue light epitaxial layer by electrons and holes injected respectively from the electrodes on the first P-type GaN-doped layer and the first N-type GaN-doped layer, not only emit blue light from the blue sub-pixel region, but also project to the upper red light epitaxial layer and the upper green light epitaxial layer, so the upper red light epitaxial layer and the upper green light epitaxial layer can not only be electroluminescent but also accept the blue light projected from the lower layer for photoluminescence, which greatly increases luminous efficiency and brightness without increasing the injected current.

The red light epitaxial layer and the green light epitaxial layer continue to epitaxially grow on the blue light epitaxial layer of the semiconductor light-emitting device of this disclosure, so no bonding process is required, and problems of low transmittance and additional voltage caused by a bonding layer are avoided.

Embodiment 2

Figure 6:
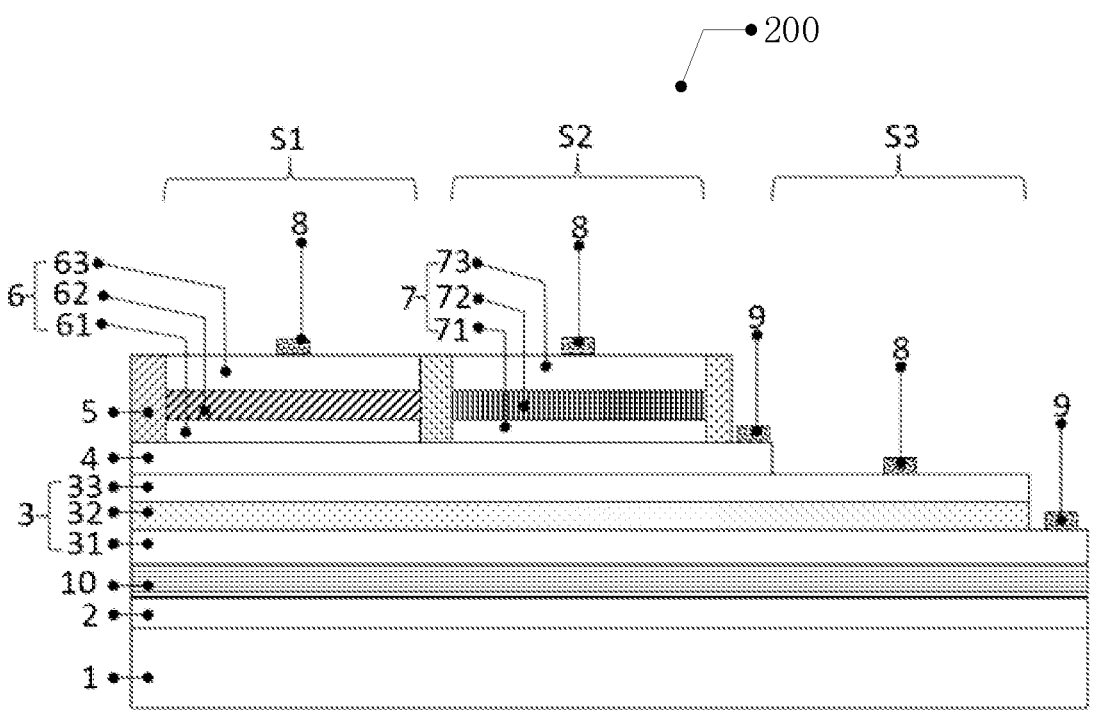
FIG. 6 is a schematic structural diagram of a semiconductor light-emitting device according to Embodiment 2 of this disclosure.

FIG. 6 is a schematic structural diagram of a semiconductor light-emitting device 200 according to Embodiment 2 of this disclosure. The semiconductor light-emitting device 200 and a preparation method for the semiconductor light-emitting device 200 according to the Embodiment 2 of this disclosure and the semiconductor light-emitting device 100 and the preparation method for the semiconductor light-emitting device according to the Embodiment 1 of this disclosure are basically the same. The only difference is that, as shown in FIG. 6, the semiconductor light-emitting device 200 according to the Embodiment 2 further includes a blue light DBR reflective layer 10 formed between the first N-type GaN-doped layer 31 and the substrate 1, and the blue light DBR reflective layer 10 is adjacent to the first N-type GaN-doped layer 31.

Compared to the Embodiment 1, a blue light DBR reflective layer 10 is added in the Embodiment 2 to reduce the original absorption of blue light by the substrate 1. The fabrication process is simple and feasible, and the luminous efficiency of the semiconductor light-emitting device 200 in this embodiment is improved.

Embodiment 3

Figure 7:
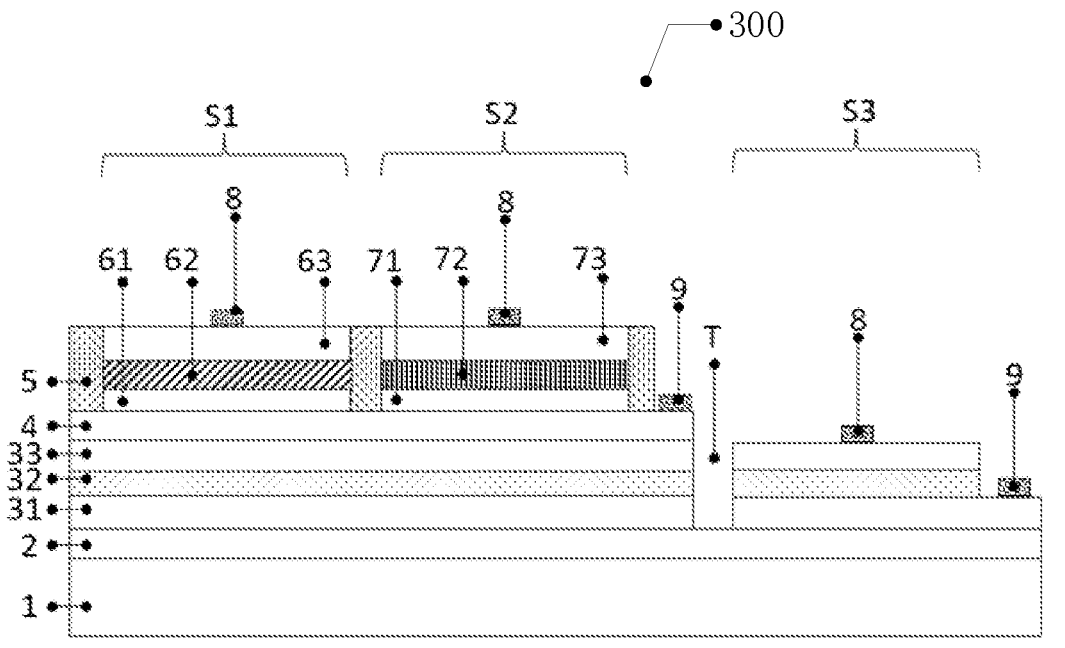
FIG. 7 is a schematic structural diagram of a semiconductor light-emitting device according to Embodiment 3 of this disclosure.

FIG. 7 is a schematic structural diagram of a semiconductor light-emitting device 300 according to Embodiment 3 of this disclosure. The semiconductor light-emitting device 300 and a preparation method for the semiconductor light-emitting device 300 according to the Embodiment 3 of this disclosure and the semiconductor light-emitting device and the preparation method for the semiconductor light-emitting device according to the Embodiment 1 or the Embodiment 2 of this disclosure are basically the same. The only difference is that, as shown in FIG. 7, a blue light epitaxial layer 3 in the blue light sub-pixel region S3 and a blue light epitaxial layer 3 in the green light sub-pixel region S1 and the red light sub-pixel region S2 are disconnected from each other and remain independent.

Specifically, an isolation trench T for isolating the blue light sub-pixels and other color light sub-pixels is etched in the blue light epitaxial layer 3 using an etching method, and the etching depth is not limited, as long as the isolation effect is achieved. The leakage current of the semiconductor light-emitting device 300 in the embodiment of this application is reduced, and the display resolution is enhanced.

Embodiment 4

Figure 8:
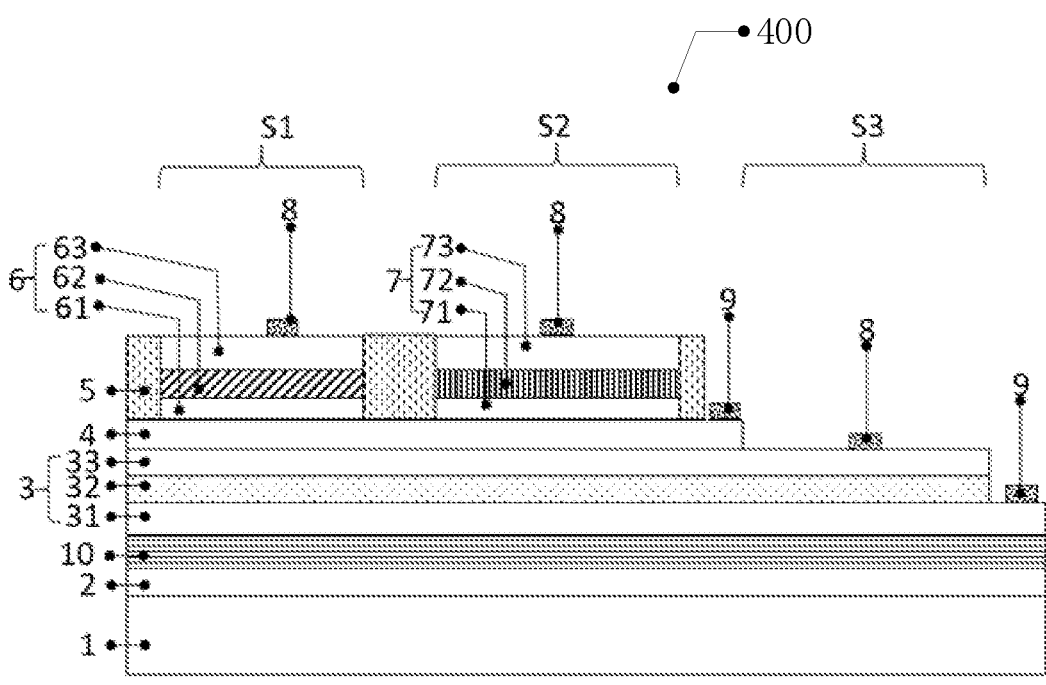
FIG. 8 is a schematic structural diagram of a semiconductor light-emitting device according to Embodiment 4 of this disclosure.

FIG. 8 is a schematic structural diagram of a semiconductor light-emitting device 400 according to Embodiment 4 of this disclosure. The semiconductor light-emitting device and a preparation method for the semiconductor light-emitting device according to the Embodiment 4 of this disclosure and the semiconductor light-emitting device and the preparation method for the semiconductor light-emitting device according to the Embodiment 1, the Embodiment 2 or the Embodiment 3 of this disclosure are basically the same. The only difference is that, in a semiconductor light-emitting device 400 in the Embodiment 4, as shown in FIG. 8, a red light sub-pixel region S2 is larger than a green light sub-pixel region S1, and a size of a through hole of an insulating dielectric mask layer is used to control a size of different sub-pixel regions.

Specifically, an insulating dielectric mask layer 5 is deposited on a common electrode layer 4, and the insulating dielectric mask layer 5 has through holes corresponding to a green light sub-pixel region 6 and a red light sub-pixel region 7. The area of the through hole corresponding to the red light sub-pixel region S2 is larger than the area of the through hole corresponding to the green light sub-pixel region S1. Since the luminous brightness of the green light epitaxial layer 6 is greater than that of the red light epitaxial layer 7, the red light sub-pixel region S2 being larger than the green light sub-pixel region S1 may improve the problem of uneven color luminescence, and the process is simple.

Embodiment 5

Figure 9:
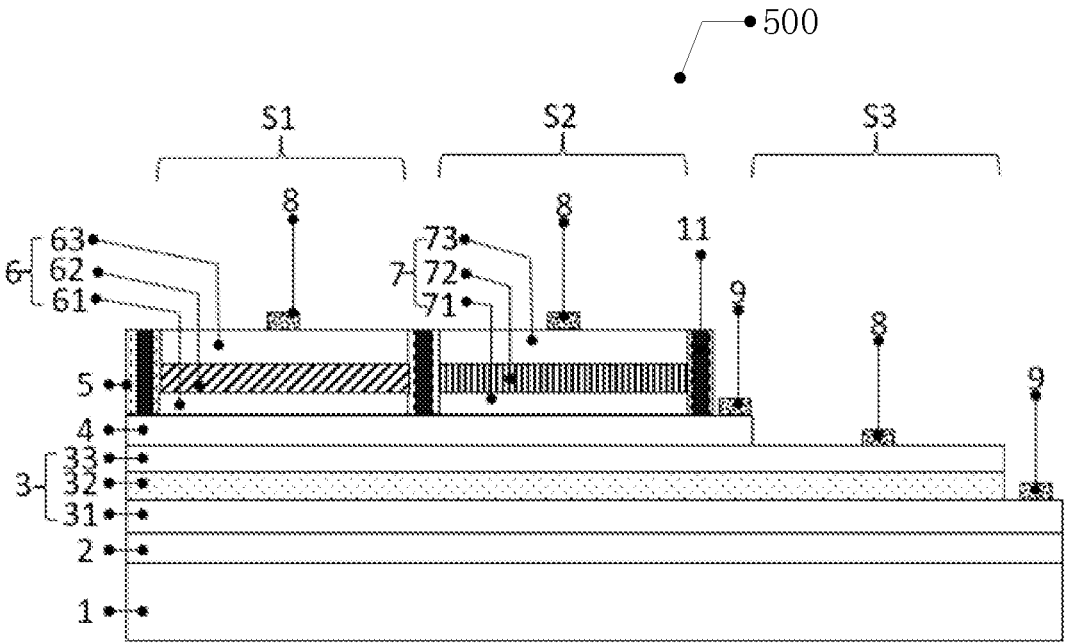
FIG. 9 is a schematic structural diagram of a semiconductor light-emitting device according to Embodiment 5 of this disclosure.

FIG. 9 is a schematic structural diagram of a semiconductor light-emitting device 500 according to Embodiment 5 of this disclosure. The semiconductor light-emitting device 500 and a preparation method for the semiconductor light-emitting device 500 according to the Embodiment 5 of this disclosure and the semiconductor light-emitting device and the preparation method for the semiconductor light-emitting device according to the Embodiment 1, the Embodiment 2, the Embodiment 3 or the Embodiment 4 of this disclosure are basically the same. The only difference is that, as shown in FIG. 9, the semiconductor light-emitting device 500 in the Embodiment 5 further includes light shielding structures 11 on both sides of a red light sub-pixel region S2 and a green light sub-pixel region S1. The light shielding structures 11 may be made of metal materials or light-absorbing materials and be disposed in an insulating dielectric mask layer 5 to prevent light leakage between different sub-pixels.

In summary, this disclosure provides a semiconductor light-emitting device and a preparation method for the semiconductor light-emitting device. The semiconductor light-emitting device with a red light sub-pixel region, a green light sub-pixel region, and a blue light sub-pixel region, including: a substrate and a blue light epitaxial layer epitaxially grown on the substrate, and a green light epitaxial layer and a red light epitaxial layer continually grown on the green light sub-pixel region and the red light sub-pixel region, respectively, on the blue light epitaxial layer, the green light epitaxial layer and the red light epitaxial layer being distributed on the blue light epitaxial layer at an interval. The semiconductor light-emitting device superimposes independent light-emitting region structures on the substrate through epitaxial growth. The blue light emitted by the blue light epitaxial layer is not only emitted from the blue light sub-pixel region, but also projected to the upper red light epitaxial layer and green light epitaxial layer. Therefore, the upper red light epitaxial layer and the upper green light epitaxial layer can not only realize electroluminescence but also accept the blue light projected from the lower layer for photoluminescence, which greatly increases the luminous efficiency and brightness.

The above description is only the preferred embodiments of this disclosure and does not limit this disclosure in any form. Although this disclosure has been disclosed as above in preferred embodiments, it is not intended to limit this disclosure. Any person skilled in the art, without departing from the scope of the technical solutions of the present disclosure, can make some changes or modifications to equivalent embodiments of equivalent changes by using the technical content disclosed above, provided that the technical solutions of the present disclosure are not deviated from. The content of the solution, any simple modifications, equivalent changes and modifications made to the above embodiments according to the technical essence of the present disclosure still fall within the scope of the technical solutions of the present disclosure.

What is claimed is:

1. A semiconductor light-emitting device, having a red light sub-pixel region, a green light sub-pixel region and a blue-light sub-pixel region, comprising:

a substrate and an epitaxial layer epitaxially grown on the substrate, the epitaxial layer comprising a blue light epitaxial layer epitaxially grown on the substrate, and a green light epitaxial layer and a red light epitaxial layer continually grown in the green light sub-pixel region and the red light sub-pixel region, respectively, the green light sub-pixel region and the red light sub-pixel region being located on the blue light epitaxial layer, and the green light epitaxial layer and the red light epitaxial layer being distributed on the blue light epitaxial layer at an interval; and P-type contact electrodes and N-type contact electrodes electrically connected to the blue light epitaxial layer, the green light epitaxial layer and the red light epitaxial layer, wherein the green light epitaxial layer and the red light epitaxial layer are both electroluminescent and photoluminescent.

2. The semiconductor light-emitting device according to claim 1, wherein the blue light epitaxial layer comprises a first N-type GaN-doped layer, a blue light light-emitting layer and a first P-type GaN-doped layer grown in sequence; the green light epitaxial layer comprises a second N-type GaN-doped layer, a green light light-emitting layer and a second P-type GaN-doped layer grown in sequence; and the red light epitaxial layer comprises a second N-type GaN-doped layer, a red light light-emitting layer and a second P-type GaN-doped layer grown in sequence; and the P-type contact electrodes are electrically connected to the first P-type GaN-doped layer, the second P-type GaN-doped layer in the red light epitaxial layer and the second P-type GaN-doped layer in the green light epitaxial layer, respectively, and the N-type contact electrodes are electrically connected to the first N-type GaN-doped layer, the second N-type GaN doped layer in the red light epitaxial layer and the second N-type GaN-doped layer in the green light epitaxial layer, respectively.

3. The semiconductor light-emitting device according to claim 2, wherein the blue light light-emitting layer is a GaN layer doped with indium element, the green light light-emitting layer is a GaN layer doped with indium element, the red light light-emitting layer is a GaN layer doped with indium element, a proportion of indium doped in the red light light-emitting layer is greater than a proportion of indium doped in the green light light-emitting layer, and the proportion of indium doped in the green light light-emitting layer is greater than a proportion of indium doped in the blue light light-emitting layer.

4. The semiconductor light-emitting device according to claim 2, further comprising:

a blue light DBR Distributed Bragg Reflection (DBR) reflective layer formed between the first N-type GaN-doped layer and the substrate, wherein the blue light DBR reflective layer is adjacent to the first N-type GaN-doped layer.

5. The semiconductor light-emitting device according to claim 1, further comprising:

an insulating dielectric mask layer, wherein the insulating dielectric mask layer is disposed on the blue light epitaxial layer, the insulating dielectric mask layer has through holes, and the green light epitaxial layer and the red light epitaxial layer are distributed in the through holes of the insulating dielectric mask layer at an interval.

6. The semiconductor light-emitting device according to claim 1, further comprising:

light shielding structures, wherein the light shielding structures are disposed on both sides of the red light sub-pixel region and the green light sub-pixel region.

7. The semiconductor light-emitting device according to claim 1, further comprising:

a common electrode layer, wherein the common electrode layer is formed above the blue light epitaxial layer, the green light epitaxial layer and the red light epitaxial layer are continually grown in the green light sub-pixel region and the red light sub-pixel region, respectively, on the common electrode layer, and the green light epitaxial layer and the red light epitaxial layer are distributed on the common electrode layer at an interval.

8. The semiconductor light-emitting device according to claim 7, wherein the blue light epitaxial layer comprises a first N-type GaN-doped layer, a blue light light-emitting layer and a first P-type GaN-doped layer grown in sequence; the green light epitaxial layer comprises a green light light-emitting layer and a second P-type GaN-doped layer which are grown in sequence; and the red light epitaxial layer comprises a red light light-emitting layer and a second P-type GaN-doped layer grown in sequence; and the P-type contact electrodes are electrically connected to the first P-type GaN-doped layer, the second P-type GaN-doped layer in the red light epitaxial layer and the second P-type GaN-doped layer in the green light epitaxial layer, respectively, and the N-type contact electrodes are electrically connected to the first N-type GaN-doped layer and the common electrode layer, respectively.

9. The semiconductor light-emitting device according to claim 1, wherein an entire surface of the blue light epitaxial layer is electroluminescent.

10. The semiconductor light-emitting device according to claim 1, further comprising:

an isolation trench separating a blue light epitaxial layer of the blue light sub-pixel region and a blue light epitaxial layer of the red light sub-pixel region and the green light sub-pixel region from each other.

11. The semiconductor light-emitting device according to claim 1, wherein an area of the red light sub-pixel region and an area of the green light sub-pixel region are different.

12. The semiconductor light-emitting device according to claim 1, wherein an area of the red light sub-pixel region is greater than an area of the green light sub-pixel region.

13. The semiconductor light-emitting device according to claim 7, wherein the substrate, the blue light epitaxial layer, the common electrode layer, and the layer where the green light epitaxial layer and the red light epitaxial layer are located are arranged in a stepped manner, the common electrode layer has an area that is not covered by the green light epitaxial layer or the red light epitaxial layer, the blue light epitaxial layer has an area that is not covered by the common electrode layer, and the substrate has an area that is not covered by the blue light epitaxial layer, and the P-type contact electrodes and the N-type contact electrodes are located in a stepped region.

14. The semiconductor light-emitting device according to claim 13, wherein the P-type contact electrodes are respectively formed on a first P-type GaN-doped layer of the blue light epitaxial layer, a second P-type GaN-doped layer of the red light epitaxial layer and a second P-type GaN-doped layer of the green light epitaxial layer; and the N-type contact electrodes are formed on a first N-type GaN-doped layer and the common electrode layer.

15. The semiconductor light-emitting device according to claim 7, further comprising:

an insulating dielectric mask layer, wherein the insulating dielectric mask layer is disposed on the blue light epitaxial layer, the insulating dielectric mask layer has through holes, and the green light epitaxial layer and the red light epitaxial layer are distributed in the through holes of the insulating dielectric mask layer at an interval, wherein the common electrode layer has an entire-surface structure, and is formed between the blue light epitaxial layer and the insulating dielectric mask layer, wherein the common electrode layer is exposed by the through holes of the insulating dielectric mask layer, the second N-type GaN-doped layer, the light-emitting layer and the second P-type GaN-doped layer are continually grown on the common electrode layer exposed by the through holes, and wherein the through holes include a first through hole and a second through hole, wherein the green light epitaxial layer is formed in the first through hole, and the red light epitaxial layer is formed in the second through hole.

* * * * *